United States Patent [19]
Kerkman et al.

[11] Patent Number: 5,689,169
[45] Date of Patent: Nov. 18, 1997

[54] TRANSIENT INDUCTANCE IDENTIFIER FOR MOTOR CONTROL

[75] Inventors: Russel J. Kerkman, Milwaukee; Jerry Thunes, Greenfield; David Schlegel, Saukville; Timothy Rowan, Wauwatosa, all of Wis.

[73] Assignee: Allen-Bradley Company, Inc., Milwaukee, Wis.

[21] Appl. No.: 402,288

[22] Filed: Mar. 10, 1995

[51] Int. Cl.$^6$ ............................................. H02P 7/00
[52] U.S. Cl. ................................. 318/807; 318/772
[58] Field of Search ............................. 318/798–815, 318/254, 439; 324/379, 158 MG; 73/826.06, 862.322, 862.193

[56] References Cited

U.S. PATENT DOCUMENTS

| | | | |
|---|---|---|---|
| 3,648,138 | 3/1972 | Kalis | 318/772 |
| 3,859,578 | 1/1975 | Botvinnik et al. | 318/772 |
| 4,543,520 | 9/1985 | Danz et al. | 318/807 |
| 4,585,985 | 4/1986 | Bose | 318/803 |
| 4,763,057 | 8/1988 | Danz et al. | 318/809 |
| 4,780,657 | 10/1988 | Brown et al. | 318/805 |
| 4,926,105 | 5/1990 | Mischenko et al. | 318/800 |
| 5,030,917 | 7/1991 | Kilman | 324/158 MG |

*Primary Examiner*—Jonathan Wysocki
*Attorney, Agent, or Firm*—Michael A. Jaskolski; John M. Miller; John J. Horn

[57] ABSTRACT

A method and apparatus used with a motor controller for determining transient inductance and rotor resistance upon commissioning of the motor. The estimator drives a single phase of the motor with an excitation current at an operating frequency, determines the d-q axis stator synchronous feedback voltages, divides the excitation current by 2 to produce a positive current signal, multiplies the operating frequency by the positive current signal to produce a current frequency signal and then divides the q-axis voltage feedback by the current frequency signal to produce the transient inductance estimate, divides the d-axis voltage feedback signal by the positive current signal and subtracts stator resistance estimate therefrom to obtain a rotor resistance estimate.

18 Claims, 10 Drawing Sheets

FIG. 1

PRIOR ART

TRANSIENT INDUCTANCE IDENTIFIER FOR MOTOR CONTROL

1. Field of the Invention

The field of the invention is motor controllers for controlling the speed of high performance electrical induction motors, and more particularly to a method and apparatus for determining the transient inductance of a motor and the motor rotor resistance for use in motor controls.

2. Description of the Art

INDUCTION MOTORS

Induction motors have broad application in industry, particularly when large horsepower is needed. A three-phase induction motor receives three phases of electrical voltage to produce a rotating magnetic stator field. A rotor contained within the stator field experiences an induced current (hence the term induction) which generates a rotor field. The interaction of the rotor field and the stator field causes rotation of the rotor.

A common rotor design is a "squirrel cage winding" in which axial conductive bars are connected at either end by shorting rings to form a generally cylindrical structure. The flux of the stator field cutting across the conductive bars induces cyclic current flows through the bars and across the shorting rings. The cyclic current flows in turn produce the rotor field.

The use of this induced current to generate the rotor field eliminates the need for slip rings or brushes to provide power to the rotor, making the design relatively maintenance-free.

FIELD-ORIENTED CONTROL OF INDUCTION MACHINES

To a first approximation, the torque and speed of an induction motor may be controlled by changing the frequency of the driving voltage and thus the angular rate of the rotating stator field. Generally, for a given torque, increasing the stator field rate will increase the speed of the rotor (which follows the stator field). Alternatively, for a given rotor speed, increasing the frequency of the stator field will increase the torque by increasing the slip, that is, the difference in speed between the rotor and the stator field. An increase in slip increases the rate at which flux lines are cut by the rotor, increasing the rotor-generated field and thus the force or torque between the rotor and stator fields.

Figure 1:
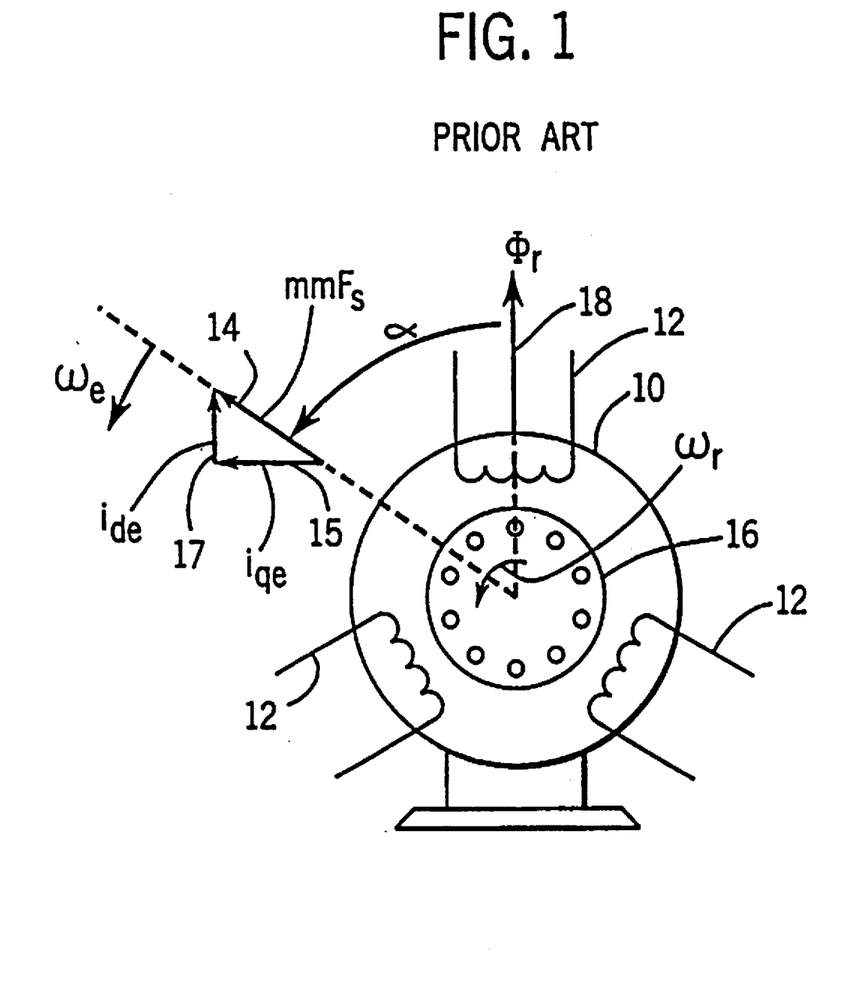
FIG. 1 is a schematic view in cross section of an induction motor showing instantaneous locations of the rotor flux, the stator mmf, and the torque and flux components of the stator mmf.

Referring to FIG. 1, the rotating phasor 14 of the stator magneto motive force ("mmf") will generally have some angle α with respect to the phasor of rotor flux 18. The torque generated by the motor will be proportional to the magnitudes of these phasors 14 and 18 but also will be a function of their angle α. The maximum torque is produced when phasors 14 and 18 are at right angles to each other (e.g., α=90°) whereas zero torque is produced if these phasors are aligned (e.g., α=0°). The phasor 14 may therefore be usefully decomposed into a torque producing component 15 perpendicular to the phasor 18 and a flux component 17 parallel to rotor flux phasor 18.

These two components 15 and 17 of the stator mmf are proportional, respectively, to two stator currents $i_{qe}$, a torque producing current, and $i_{de}$, a flux producing current, which may be represented by orthogonal vectors in the rotating frame of reference (synchronous frame of reference) of the stator flux having slowly varying magnitudes. The subscript "e" is used to indicate that a particular quantity is in the rotating frame of stator flux.

Accordingly, in controlling an induction motor, it is generally desired to control not only the frequency of the applied voltage (hence the speed of the rotation of the stator flux phasor 14) but also the phase of the applied voltage relative to the current flow and hence the division of the currents through the stator windings into the $i_{qe}$ and $i_{de}$ components. Control strategies that attempt to independently control the currents $i_{qe}$ and $i_{de}$ are generally termed field oriented control strategies ("FOC").

Generally, the production of any given set of currents $i_{qe}$ and $i_{de}$ requires that the stator be excited with voltages $V_{qe}$ and $V_{de}$ as follows:

$$V_{qe} = r_s i_{qe} + \omega_e \lambda_{de} \tag{1}$$

$$V_{de} = r_s i_{de} - \omega_e \lambda_{qe} \tag{2}$$

where $V_{qe}, V_{de}$=terminal voltages;

$r_s$=stator resistance;

$i_{qe}, i_{de}$=terminal current components;

$\omega_e$=electrical field frequency; and $\lambda_{de}, \lambda_{qe}$=stator flux linkages and where $r_s i_{de}, r_s i_{qe}$=stator resistance voltage drops; and $\omega_e \lambda_{de}, \omega_e \lambda_{qe}$=counter electromotive forces (EMFs).

As well-known in the art of FOC:

$$\lambda_{de} = L_s i_{de} \tag{3}$$

and $$\lambda_{qe} = L_\sigma i_{qe} \tag{4}$$

where $L_s$=motor winding inductance $L_\sigma$=transient inductance

COMMISSIONING PROBLEMS

Generally, it is desirable to design field-oriented controllers that are capable of driving motors of many different designs and varying sizes. Such versatility cuts down on research, development, and manufacturing costs as well as producing easily serviceable controllers.

Unfortunately, while versatile controllers are cost-effective, they cannot control motor operation precisely unless they can adjust the division of d and q-axis currents through the stator windings to account for motor-specific operating characteristics. For example, both stator resistance $r_s$ and inductances $L_s$, $L_\sigma$ and therefore flux linkages $\lambda_{de}$, $\lambda_{qe}$, are functions of motor design, geometry, and manufacturing tolerances. In fact, where manufacturing tolerances are relatively low, stator resistance $r_s$ and inductances $L_s$, $L_\sigma$ will often vary among motors having the same design.

Referring again to Equations 1 and 2, in order to control excitation voltages $V_{de}$, $V_{qe}$, both the stator resistance $r_s$ and inductances $L_s$ and $L_\sigma$ must be determined. The stator resistance and inductance are particularly important parameters during motor start-up, as initial estimates are required prior to rotor movement to ensure correct field orientation and achieve torque linearity. If inaccurate values are used during start-up, rotation is not smooth and torque linearity is corrupted.

Once a motor is commissioned, both the slip and field current must be updated to account for changes in rotor resistance and flux commands. This is well known in the art and one method described in more detail is laid open in Kerkman, et al., U.S. Pat. No. 5,032,771 issued Jul. 16, 1991.

Various methods of determining stator resistance $r_s$ prior to rotor movement are well-known and any one of the known methods could be used with the present invention. For example, $r_s$ may be derived by injecting signals into the stator windings and observing feedback voltage and current values.

Unfortunately, no simple and straightforward method of accurately determining transient inductance prior to rotor movement has been found. The present methods either produce estimates that are too inaccurate to be useful because of oversimplification of the motor model or require complex identification algorithms that build in parameter uncertainty that degrades the control.

Therefore, it would be advantageous to have a non-invasive, non-disturbing method and/or apparatus that could accurately determine transient inductance without the above deficiencies.

SUMMARY OF THE INVENTION

The present invention includes a system for accurately determining a transient inductance value in an electric motor upon commissioning of the motor. A single phase of the motor is excited with a sinusoidally varying d-axis current while the q-axis is regulated to have zero current. Assuming a balanced three-phase motor, the invention models the forward field of the excited single phase as an equivalent circuit, as known in the art. Using the model, a voltage equation can be written for the single phase, and simplifications can be made such that:

$$V_s = (r_s + r_r + \omega_e L_\sigma) i_s \qquad (5)$$

where;

$V_s$=single phase voltage;

$r_s$=stator resistance;

$r_r$=rotor resistance;

$L_\sigma$=transient inductance;

$\omega_e$=electrical excitation frequency; and $i_s$=stator current in the stationary frame of reference.

Equation 5 may be resolved into q and d axes components in the synchronous reference frame. This transformation produces two voltage equations such that at sufficiently high values of excitation frequency:

$$\begin{bmatrix} V_{qe} \\ V_{de} \end{bmatrix} = \begin{bmatrix} \omega_e L_\sigma \\ r_s + r_r \end{bmatrix} \frac{i_{de}}{2} \qquad (6)$$

The stator resistance $r_s$ can be found by various methods well known in the art. The frequency $\omega_e$ and d-axis current $i_{de}$ are controlled. The q and d-axis voltages $V_{qe}$, $V_{de}$ can be measured and provided as feedback voltages. Thus, matrix Equation 6 can be solved for the transient inductance $L\sigma$. In addition, if the rotor resistance $r_r$ is of interest, matrix Equation 6 can also be solved for that characteristic value as well.

The present invention eliminates the need for complex calculations, thus greatly simplifying evaluation of the data. By passing the feedback voltage values through a digital filter, the present invention may also take advantage of known harmonic content of the feedback voltage to simplify averaging techniques and greatly reduce "noise" within the feedback voltage signal, thus producing a more reliable transient inductance estimate.

Other and further objects and aspects of the present invention will become apparent during the course of the following description and by reference to the accompanying drawings.

DESCRIPTION OF THE PREFERRED EMBODIMENT

In the description that follows, an "e" subscript denotes that a signal is referred to the synchronous frame of reference, an "s" subscript denotes that a signal is referred to the stationary frame of reference, a "c" subscript denotes that a signal is a commissioning signal, and an "f" subscript denotes a feedback signal.

While the following description details various blocks, steps, and functions, it should be remembered that all of these elements are meant to be implemented in software as computer programs and represent algorithms for execution by a conventional-type digital processor adapted for industrial applications, such as a model 8096 microelectronic processor as supplied by Intel Corporation of Santa Clara, Calif.

Figure 2:
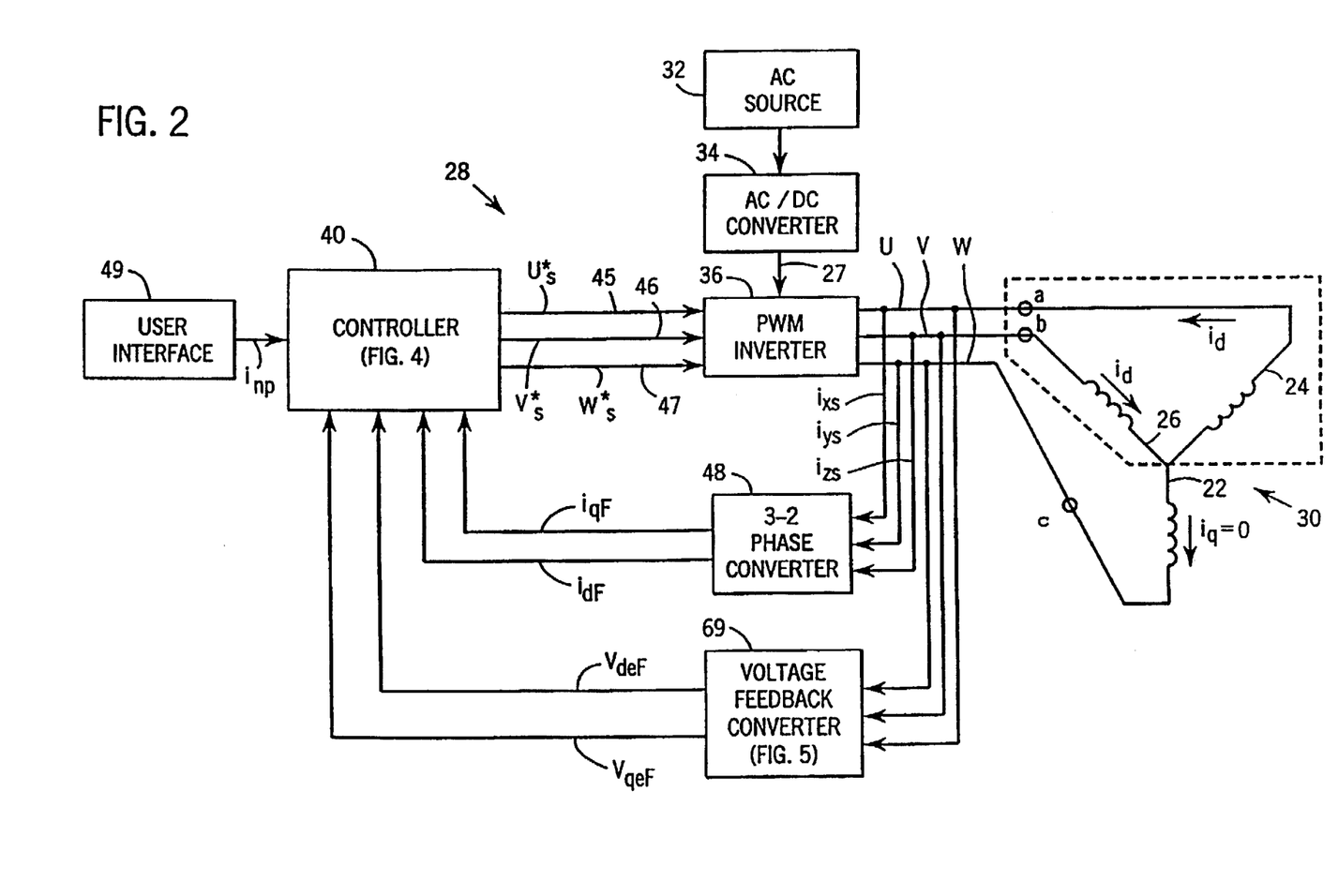
FIG. 2 provides an overall block diagram of a control system for use in controlling an AC induction motor in accordance with the present invention.

Referring now to FIG. 2, a control system 20, which will be explained in more detail below, can provide sinusoidally varying stator voltages U, V, W across each of three motor windings 22, 24, 26 to induce rotor movement. Referring also to FIG. 1, the stator voltages U, V, W are functions of the impressed synchronous d and q-axis currents. Referring also to FIG. 1, the d-axis current $i_{de}$ is parallel to the rotor flux phasor 18 and produces flux rather than torque. The q-axis current $i_{qe}$, however, is perpendicular to the rotor flux phasor 18 and produces a torque rather than a flux.

By regulating the q-axis to have zero current in the stationary frame of reference ($i_{qs}=0$), while providing a sinusoidal d-axis stator current, flux can be created between the stator and rotor without providing torque that would tend to rotate the rotor. The flux results in both mutual and self inductance. Because the rotor does not move during such regulation, the rotor is said to be blocked or locked, and tests run during such regulation are said to be "bumpless".

Referring still to FIG. 2, current can be limited to the d-axis by regulating the current through a first winding 22 to zero, while providing current to a second winding 26 and allowing the provided current to flow back to the control system 20 through the third winding 24. Because d-axis current $i_{ds}$ is only provided on a single phase, the stator field 14 divides evenly into forward and reverse rotating fields.

In accordance with the double-revolving field concept, the d-axis current through the stator windings can be resolved into forward and reverse current components. Each of the forward and reverse current components produces induction motor action, but the corresponding torques are in opposite directions. Importantly, because the q-axis current is zero during single-phase excitation, the total torque is zero and therefore, the torques corresponding to the forward and reverse current components must be equal but of opposite signs.

Because the currents are proportional to the forward and reverse torques, the magnitude of each of the forward and reverse current components must also be equal. Therefore, if the total single-phase current is $i_{ds}$, the forward current component $i_{ds}+$ must have a magnitude of $i_{ds}/2$ and the reverse current component $i_{ds-}$ must also have a magnitude of $i_{ds}/2$.

Figure 3:
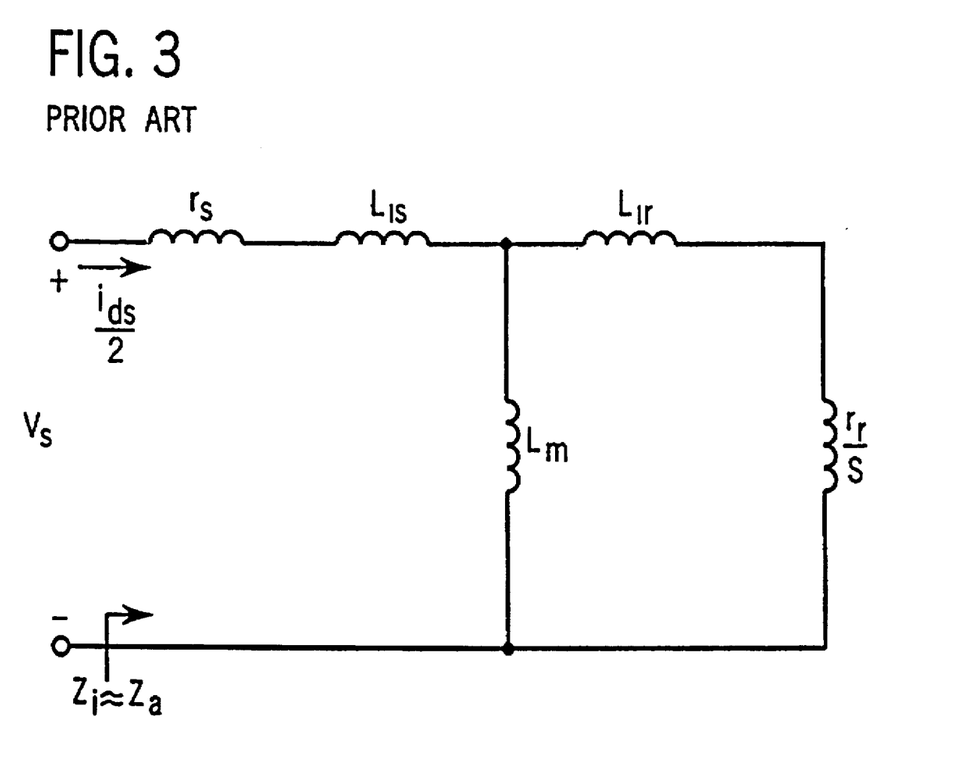
FIG. 3 is the equivalent circuit of a single phase of the forward field of an induction motor.

Referring now to FIG. 3, an equivalent circuit for the forward component of a single phase of a three-phase motor can be observed. The stator and rotor are characterized by resistances $r_s$ and $r_r$, respectively. In addition, the stator and rotor are characterized by various related inductances $L_m$, $L_{lr}$, $L_{ls}$ produced by flux among the stator and rotor windings.

Most of the flux produced by the stator and rotor windings (roughly 90% in typical machines) crosses the air gap and links both the stator and rotor windings; this flux is termed the mutual flux and is represented by a mutual inductance $L_m$. Small percentages of the flux, however, do not cross the air gap but link only the rotor or the stator windings; these are, respectively, the rotor leakage flux and the stator leakage flux and are represented by leakage inductances $L_{lr}$, $L_{ls}$ respectively. The leakage fluxes comprise slot and tooth-tip leakage, end turn leakage, and space harmonics in the air gap field.

Referring also to FIGS. 1 and 3, the s stands for slip and is the difference between the speed of the stator mmf phasor 14 and the rotor 16. When the stator mmf phasor 14 and rotor 16 are synchronous, the rotor torque is zero and s=1. Thus, when current is limited to the d-axis, s=1 and $r_{r/s}=r_r$ Referring still to FIG. 3, the input impedance $Z_i$ of the equivalent circuit is given by Equation 7 below:

$$Z_i = r_s + r_r \frac{\omega_e^2 L_m^2}{r_r^2 + \omega_e^2 (L_{lr}+L_m)^2} + \quad (7)$$

$$j\omega_e \left( L_{ls} + \frac{L_m[\omega_e^2 L_{lr}(L_{lr}+L_m) + r_r^2]}{r_r^2 + \omega_e^2 [L_{lr}+L_m]^2} \right)$$

Both the effective resistance (real component of the input impedance) and the inductance (imaginary component of the input impedance) are functions of the electrical angular velocity $\omega_e$. Assuming a relatively high frequency $\omega e$ (i.e.>5H$_z$), Equation 7 can be simplified as:

$$Z_a = r_s + r_r + j\omega_e \frac{(L_{ls}+L_m)(L_{lr}+L_m) - L_m^2}{(L_{lr}+L_m)} \quad (8)$$

where $Z_a$ is an approximate equivalent impedance. Equation 8 can be simplified to:

$$Z_a = r_s + r_r + j\omega_e L\sigma \quad (9)$$

where, $$L\sigma = \frac{(L_{ls}+L_m)(L_{lr}+L_m) - L_m^2}{(L_{lr}+L_m)} \quad (10)$$

Equation 9 is an approximate equation which is the series combination of the stator and rotor resistances $r_s$, $r_r$ and a transient inductance $L_\sigma$.

Figure 9:
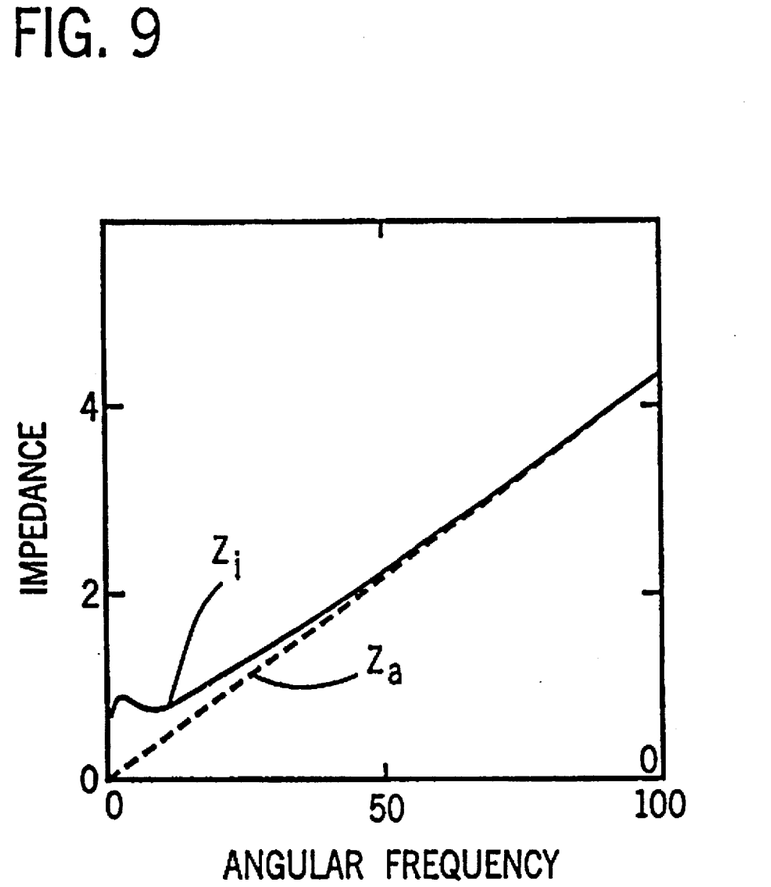
FIG. 9 shows a graph depicting the imaginary components of both the input impedance and the approximate impedance of the equivalent circuit shown in FIG. 3 as a function of frequency.

Referring to FIG. 9, the imaginary components of both the input impedance $Z_i$ in Equation 7, and the approximate impedance $Z_a$ in Equation 8, plotted as functions of the frequency, can be observed. This data was derived using a computer and represents ideal conditions wherein skin effect phenomenon at high frequencies is neglected (skin effect is discussed in more detail below).

Clearly, as the frequency is increased, the imaginary component of approximate impedance $Z_a$ (and hence transient inductance $L\sigma$) approaches the imaginary component of the input impedance $Z_i$. Thus, the approximate impedance simplification at relatively high frequencies can be made and will produce an accurate transient inductance estimate $L\sigma$.

A single excitation of an induction motor may also be analyzed from the view point of multiple reference frames. In this case, the applied voltage or current is resolved into forward and reverse components. For single phase excitation at locked rotor with a current regulated PWM inverter, the system equation becomes:

$$\begin{bmatrix} V_q \\ V_d \\ 0 \\ 0 \end{bmatrix} = \begin{bmatrix} r_s & \omega_e L_s & 0 & \omega_e L_m \\ -\omega_e L_s & r_s & -\omega_e L_m & 0 \\ 0 & \omega_e L_m & r_r & \omega_e L_r \\ -\omega_e L_m & 0 & -\omega_e L_r & r_r \end{bmatrix} \begin{bmatrix} 0 \\ \dfrac{I_d}{2} \\ i_{qr} \\ i_{dr} \end{bmatrix} \quad (11)$$

The two zeros in the lower portion of the left hand term in the matrix equation 11 above represent the zero voltage values across the rotor winding. Using Equation 11, two equations can be written for the d and q axis rotor currents as:

$$0 = (\omega_e L_m)(I_d/2) + (i_{qr})(r_r) + (i_{dr})(\omega_e L_r) \quad (12)$$

$$0 = (-\omega_e L_r)(i_{qr}) + (r_r)(i_{dr}) \quad (13)$$

Solving for $i_{qr}$ and $i_{dr}$, steady state solutions for the rotor currents are:

$$\begin{bmatrix} i_{qr} \\ i_{dr} \end{bmatrix} = \begin{bmatrix} \dfrac{-\omega_e L_m r_r}{r_r^2 + \omega_e^2 L_r^2} \\ \dfrac{-\omega_e^2 L_m L_r}{r_r^2 + \omega_e^2 L_r^2} \end{bmatrix} \dfrac{I_d}{2} \quad (14)$$

Allowing for the effects of a large excitation frequency $\omega_e$ on Equation 14, estimated steady state solutions for the rotor currents are:

$$\begin{bmatrix} I_{qr} \\ I_{dr} \end{bmatrix} = \begin{bmatrix} \dfrac{-L_m r_r}{\omega_e L_r^2} \\ \dfrac{-L_m}{L_r} \end{bmatrix} \dfrac{I_d}{2} \quad (15)$$

Next, combining Equations 11 and 15, two equations for the d and q axis synchronous stator winding voltages $V_q$ and $V_d$ can be written as:

$$V_q = (\omega_e L_s)\left(\dfrac{I_d}{2}\right) + (\omega_e L_m)\left(\dfrac{-L_m}{L_r}\right)\left(\dfrac{I_d}{2}\right) \quad (16)$$

$$V_d = (r_s)\left(\dfrac{I_d}{2}\right) - (\omega_e L_m)\left(\dfrac{-L_m r_r}{\omega_e L_r^2}\right)\left(\dfrac{I_d}{2}\right) \quad (17)$$

Solving for $V_d$ and $V_q$, the resulting synchronous terminal voltages are given by Equation 18 below:

$$\begin{bmatrix} V_q \\ V_d \end{bmatrix} = \begin{bmatrix} \omega_e\left(\dfrac{L_s L_r - L_m^2}{L_r}\right) \\ r_s + r_r \end{bmatrix} \dfrac{I_d}{2} \quad (18)$$

As well known in the art:

$$L_r = L_{lr} + L_{lm} \quad (19)$$

$$L_s = L_{ls} + L_{lm} \quad (20)$$

where $L_r$ is the rotor inductance and $L_s$ is the stator inductance. Thus, Equation 10 can be simplified as $$L_\sigma = \dfrac{L_s L_r - L_m^2}{L_r} \quad (21)$$

Combining Equations 18 and 21:

$$\begin{bmatrix} V_q \\ V_d \end{bmatrix} = \begin{bmatrix} \omega_e L_\sigma \\ r_s + r_r \end{bmatrix}\begin{bmatrix} \dfrac{I_d}{2} \end{bmatrix} \quad (22)$$

Matrix Equation 22 can then be solved for the transient inductance $L\sigma$ as:

$$L_\sigma = \dfrac{2V_q}{\omega_e I_d} \quad (23)$$

$V_q$ can be measured and supplied as a feedback signal. The electrical frequency $\omega_e$ and synchronous d-axis current $i_d$ are supplied values. Thus, the transient inductance can easily be determined from Equation 23.

As known in the art, when high-frequency current signals are sent through a conductor, the field inside the conductor is essentially zero. Any current density or electric field intensity established at the surface of the conductor decays rapidly at short distances into the conductor. Electromagnetic energy is not transmitted in the interior of the conductor; it travels in the region surrounding the conductor or in the "skin" of the conductor and hence, this phenomenon is termed "skin effect". Experiments have shown that skin effect results in inaccurate inductance estimations at high frequencies.

Thus, while Equations 9, and 15–23 are only accurate when a relatively high frequency is used, the frequency used in the present invention should be sufficiently low that skin effect is negligible. It has been found that a relatively accurate balance can be struck if the commissioning frequency is between 15 and 40 Hertz and is ideally approximately 30 Hertz.

Referring again to FIG. 2, the present invention will be described in the context of a pulse width modulated (PWM) motor control 28 that receives a nameplate-rated current $i_{np}$ through a user interface 49 and produces voltage pulse trains U, V and W to drive a motor 30 at a commanded frequency.

The motor control 28 (also called a "drive") includes a power section that receives power at a line frequency of 60 Hz from a three-phase AC power source 32. The three phases of the power source are connected to an AC/DC power converter 34 and the power section of the drive. The AC/DC power converter 34 rectifies the alternating current signals from the AC source 32, to produce a DC voltage on a DC bus 27 that connects to power inputs of a pulse width modulating (PWM) invertor 36, which completes the power section of the drive. The AC source 32, AC/DC power converter 34, and DC bus 27 provide a DC source for generating a DC voltage of constant magnitude.

The PWM invertor 36 includes a group of switching elements which are turned on and off to convert this DC voltage to pulses of constant magnitude. The pulse-train pattern from a PWM invertor is characterized by a first set of positive-going pulses of constant magnitude but of varying pulse width followed by a second set of negative-going pulses of constant magnitude and of varying pulse width. The RMS value of this pulse train pattern approximates one cycle of the sinusoidal AC waveform. The pattern is repeated to generate additional cycles of the AC waveform.

To control the frequency and magnitude of the resultant AC power signals U, V, W to the motor, AC invertor control signals $U_s^*$, $V_s^*$, $W_s^*$ are applied to the PWM invertor on lines 45, 46, and 47. The PWM voltage invertor 36 receives the three balanced AC invertor control signals, $U_s^*$, $V_s^*$, $W_s^*$, which vary in phase by 120°. The magnitude and frequency of these signals determine the pulse widths and the number of the pulses in pulse trains U, V, W, which are applied to the terminals a, b and c of the motor.

Figure 4:
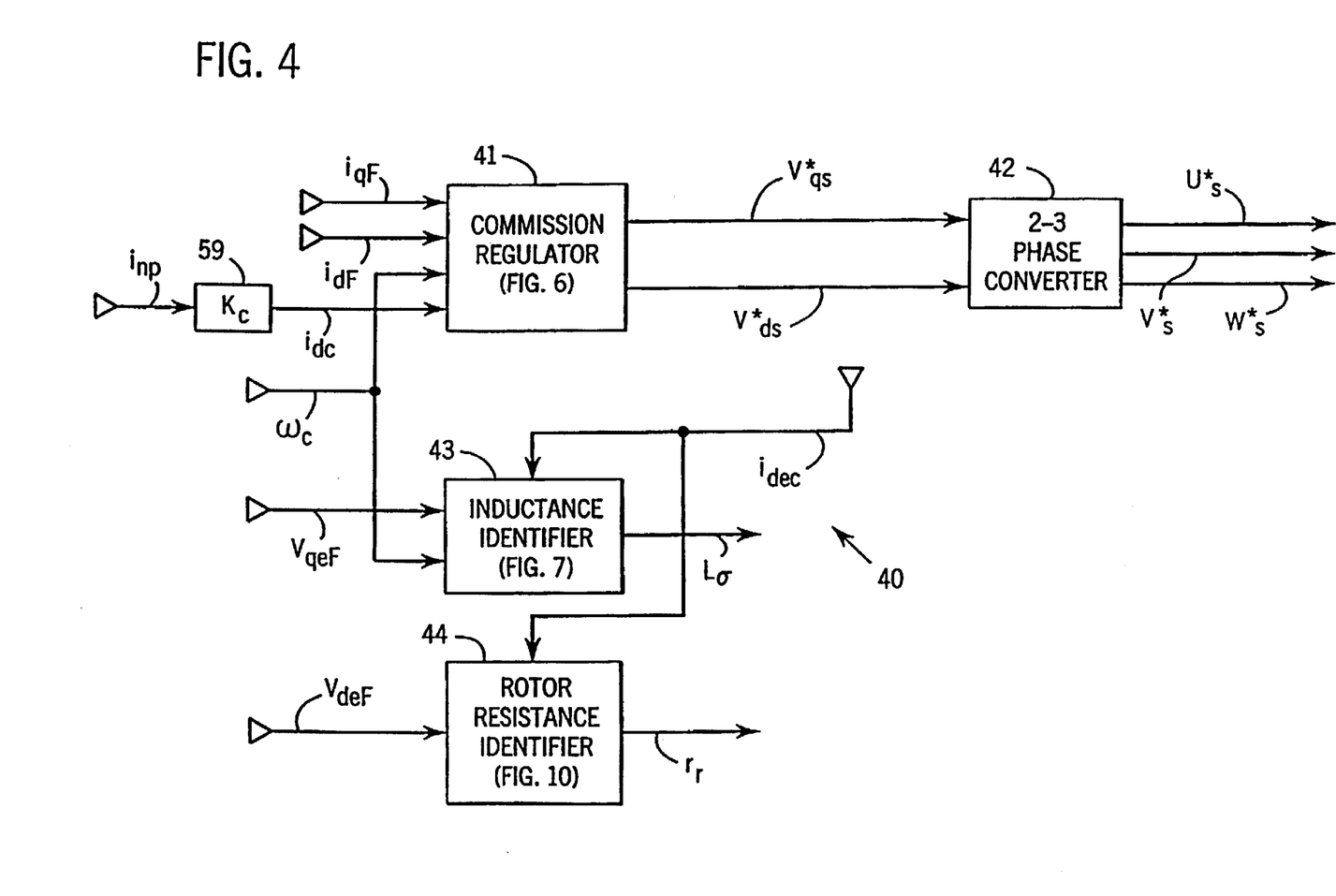
FIG. 4 is a block diagram of the controller shown in FIG. 2.

Referring now to FIG. 4, the controller 40 includes a commission regulator 41, a 2–3 phase converter 42, an inductance identifier 43, and a rotor resistance identifier 44. The nameplate current signal $i_{np}$ is the rated winding current at full load and is a value which is normally supplied by the motor manufacturer. The nameplate current signal $i_{np}$ is stepped down at a commissioning constant block 59 to a percentage of the rated value. Generally, this percentage will be between 25% and 100% of the rated current value. The constant block 59 produces a d-axis commissioning current $i_{dc}$. That value is used by the commission regulator 41 to drive a single phase of the motor.

Figure 6:
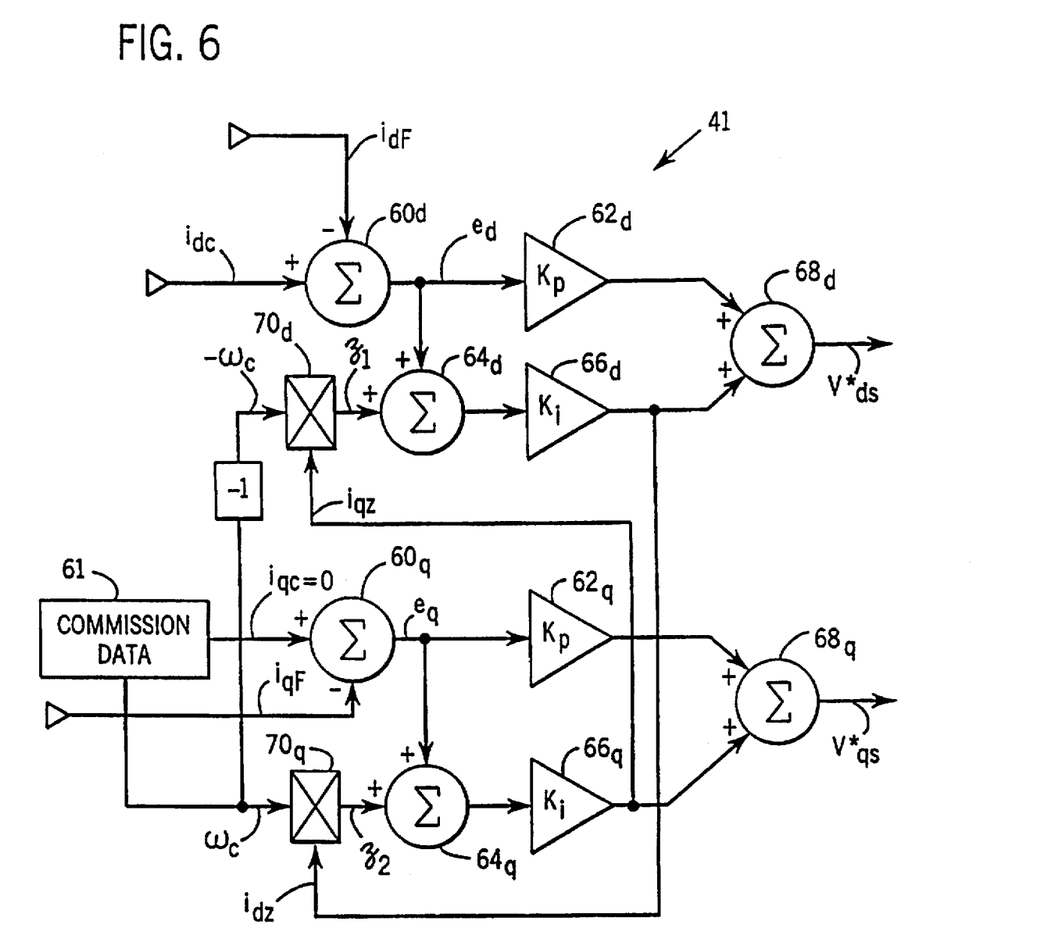
FIG. 6 provides a block diagram of the commission regulator shown in FIG. 4.

Referring to FIG. 6, commission data memory block 61 provides both the optimal angular velocity signal $\omega_c$ for commissioning (approximately 30 $H_z$) and a q-axis commissioning current signal $i_{qc}$ where $i_{qc} = 0$. The regulator 41 also receives the d-axis commissioning signals $i_{dc}$. The commissioning signals $i_{qc}$, $i_{dc}$ are compared with the current feedback signals $i_{qf}$, $i_{df}$ from the stator windings. It is the function of the regulator 41 to produce corrected signals $V_{ds}^*$, $V_{qs}^*$ which will drive the invertor 36 in such a manner as to cause the respective feedback signals $i_{qf}$ and $i_{df}$ to equal the commissioning signals $i_{dc}$, $i_{qc}$.

The commission regulator 41 provides a combination of proportional control action, integral control action, and cross-coupled speed compensation action. The "q" phase and "d" phase are handled in the same manner, and corresponding functional blocks and circuit elements in each phase of the current regulator have been given the same reference number.

Referring still to FIG. 6, the q-axis current feedback signal $i_{qf}$ is subtracted from the q-axis commissioning signal $i_{qc}$ at a summing point 60q. The resulting error signal $e_q$ produces a proportional control signal through a proportional block 62q and an integral control signal through blocks 64q, 66q. These two control signals are added together at summing point 68q to produce the corrected q-axis commissioning signal $V_s^*$.

This corrected q-axis commissioning signal $V_{qs}^*$ also includes a cross-coupled component which increases in magnitude at higher frequencies $\omega_c$. It is produced by a multiplier block 70q that receives a cross-coupled signal $i_{ds}$ from the integrator block 66d of the other phase. The amplitude of this cross-coupled signal is modulated by a second input to the multiplier 70q which is proportional to the frequency $\omega_c$. The second input is the DC frequency signal $\omega_c$. The cross-coupled component which is output by the multiplier 70q is added at a summing point 64q which connects to the input of the integrator 66q.

The details of this regulator 41 have been previously shown and described in more detail in Kerkman et al., U.S. Pat. No. 4,680,695 issued Jul. 14, 1987. In effect, the regulator forces the error signals $e_q$ and $e_d$ to ensure the synchronous frame currents are regulated to be commanded values (i.e. $i_{qe}=0 i_{de}=i_{s/2}$).

Referring again to FIG. 4, the corrected d and q-axis commissioning signals $V_{qs}^*$ and $V_{ds}^*$ are provided to a 2–3 phase converter 42 which converts the signals from two phase to three phase producing the voltage commands $U_s^*$, $V_s^*$, $W_s^*$ which are used to drive the PWM invertor 36.

Figure 5:
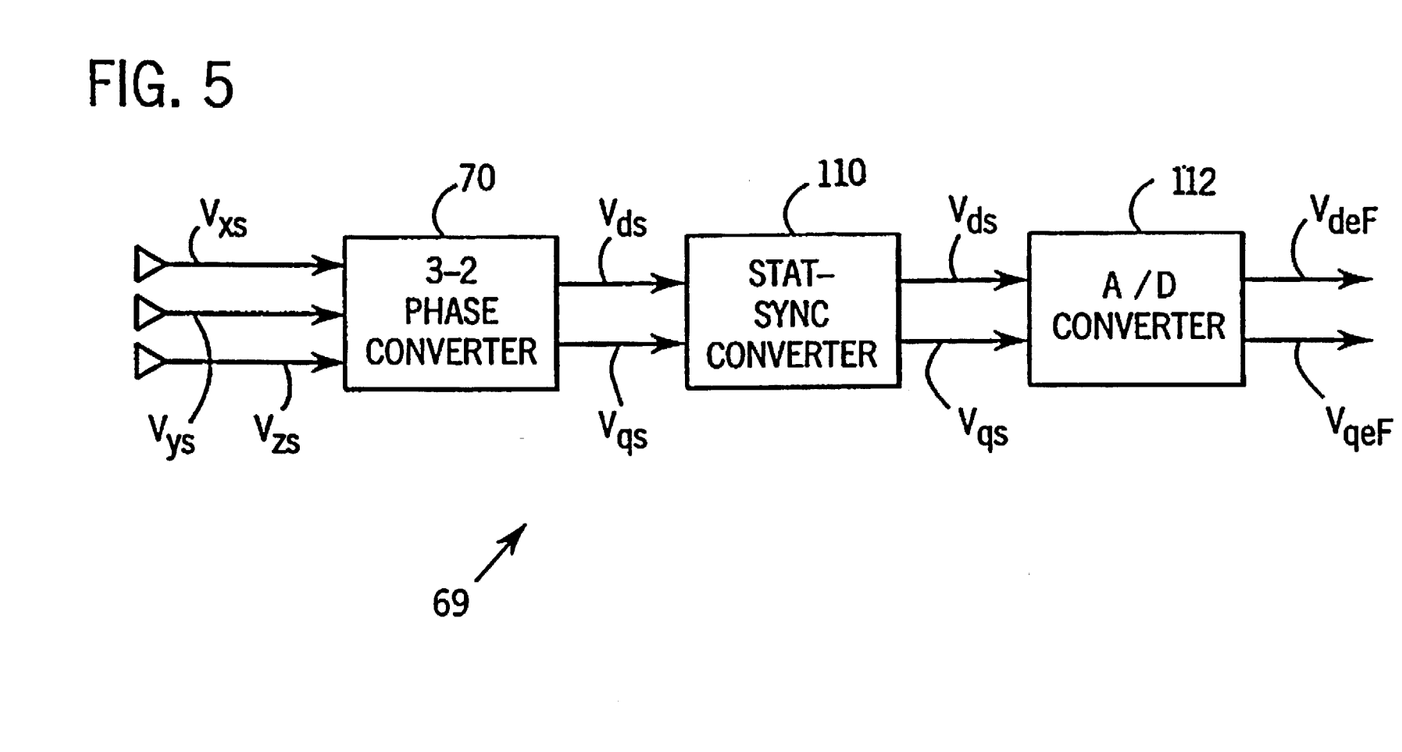
FIG. 5 is a block diagram of the voltage feedback converter shown in FIG. 2.

D and q-axis voltage feedback signals $V_{qeF}$, $V_{deF}$ in the synchronous frame of reference are used by the inductance identifier 43 and rotor resistance identifier 44. Referring also to FIG. 2, any of a plurality of different voltage sensors which are well-known in the art could be used to sense the stator winding voltages U, V, W and provide the sensed analog signals to a voltage feedback converter 69. Referring also to FIG. 5, the voltage feedback converter 69 includes a 3–2 phase converter 70, an A-to-D converter 112, and a stationary to synchronous converter 110. The 3–2 phase converter converts the stator winding voltages U, V, W to the dq stationary frame of reference producing two phase voltage signals $V_{ds}$, $V_{qs}$.

The stationary to synchronous converter 110 converts signals $V_{ds}$, $V_{qs}$ into signals that are synchronous with the stator voltage phasor producing the synchronous voltage feedback signals $V_{deF}$, $V_{qeF}$ according to the following matrix equation:

$$\begin{bmatrix} V_{qeF} \\ V_{deF} \end{bmatrix} = \begin{bmatrix} \cos\theta & -\sin\theta \\ \sin\theta & \cos\theta \end{bmatrix} \begin{bmatrix} V_{qs} \\ V_{ds} \end{bmatrix} \quad (24)$$

These quantities are converted from analog signals to digital data by the A to D converter 112.

Figure 7:
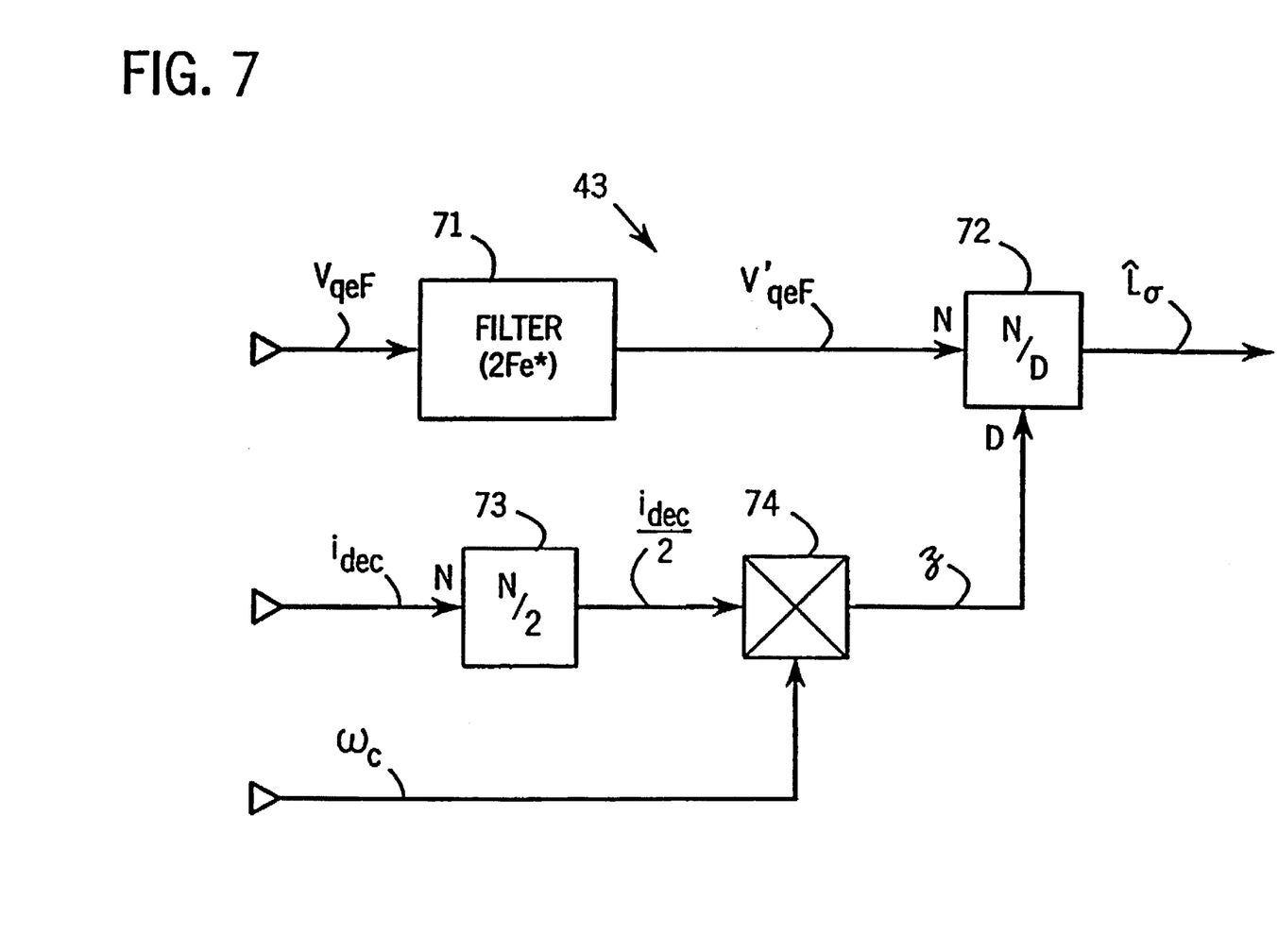
FIG. 7 provides a block diagram of a transient inductance identifier shown in FIG. 4.

Referring now to FIG. 7, the inductance identifier 43 includes a filter 71, two dividers 72, 73, and a multiplier 74. The commissioning signal $i_{dec}$ is divided by two at divider 73 and the resultant is multiplied by the frequency $\omega_c$ at multiplier 74 to produce quantity $\zeta$. The q-axis feedback voltage $V_{qeF}$ is filtered at filter 76 to produce a filtered q-axis voltage feedback signal $V_{qeF}'$ that has little harmonic content. The filtered q-axis voltage signal $V_{qeF}'$ is then divided by the quantity $\zeta$ at divider 75 to produce the transient inductance estimate L$\sigma$.

Figure 8:
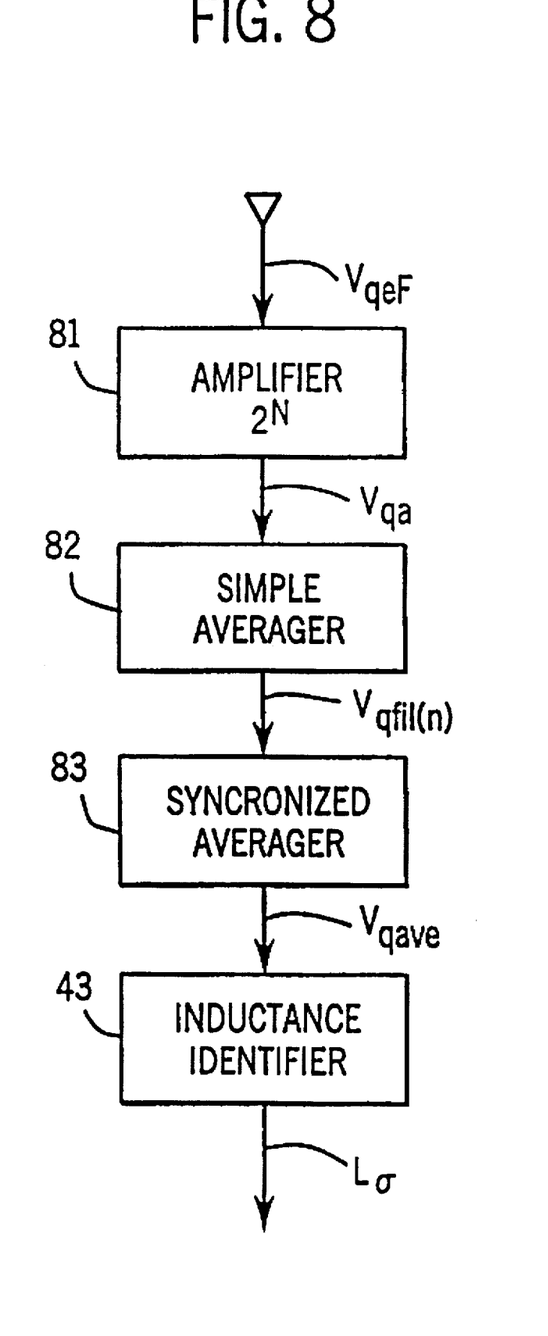
FIG. 8 provides a block diagram of the filter shown in FIG. 7.

Referring now to FIG. 8, the filter 71 used to eliminate the harmonic frequencies in the q-axis feedback voltage signal $V_{qeF}$ includes two digital averages: a simple averager 82 and a synchronized averager 83, as well as an amplifier 81. Clearly additions to this basic structure are possible and could be implemented by one of ordinary skill in the art.

The amplifier 81 receives the q-axis feedback voltage $V_{qeF}$ and steps that value up by $2^N$ where N is the digital amplification needed for resolution purposes. The amplifier produces amplified signal $V_{qa}$. The simple averager 82 takes the amplified signals $V_{qa}$ and applies the following equation:

$$V_{qfil(n)} = V_{qfil(n-1)} + \frac{V_{qa} - V_{qfil(n-1)}}{C_{fil}} \quad (25)$$

Where $C_{fil}$ is the filter coefficient and $V_{qfil(n)}$ is the filtered voltage value. The resulting filtered q-axis voltage $V_{qfil}$ is provided to the synchronized averager 83 which takes advantage of the known harmonic content of the feedback voltages and averages the harmonics over the known period. Thus, the output signal has a substantially lower second harmonic component. The averaging takes place according to the following equation:

$$V_{qave} = \frac{\sum_{i=1}^{Z}}{N_{count}} V_{qfil(i)} = T_{\mu p} \frac{\sum_{i=1}^{Z}}{T_e} V_{qfil(i)} \quad (26)$$

which in turn can be expressed as:

$$V_{qave} = T_{\mu p} \cdot F e \cdot \sum_{i=1}^{Z} V_{qfil(i)} \quad (27)$$

where $T_{\mu p}$ is the microprocessor update rate, $F_e$ is the operating frequency of the single phase current commands and Z is an arbitrary count number. $V_{qave}$ from Equation 27 can be substituted into Equation 23 for $V_{qe}$ and Equation 23 can then be solved for the transient inductance L$\sigma$. The resultant will have to be scaled again to account for the digital amplification introduced earlier for resolution purposes.

Figure 10:
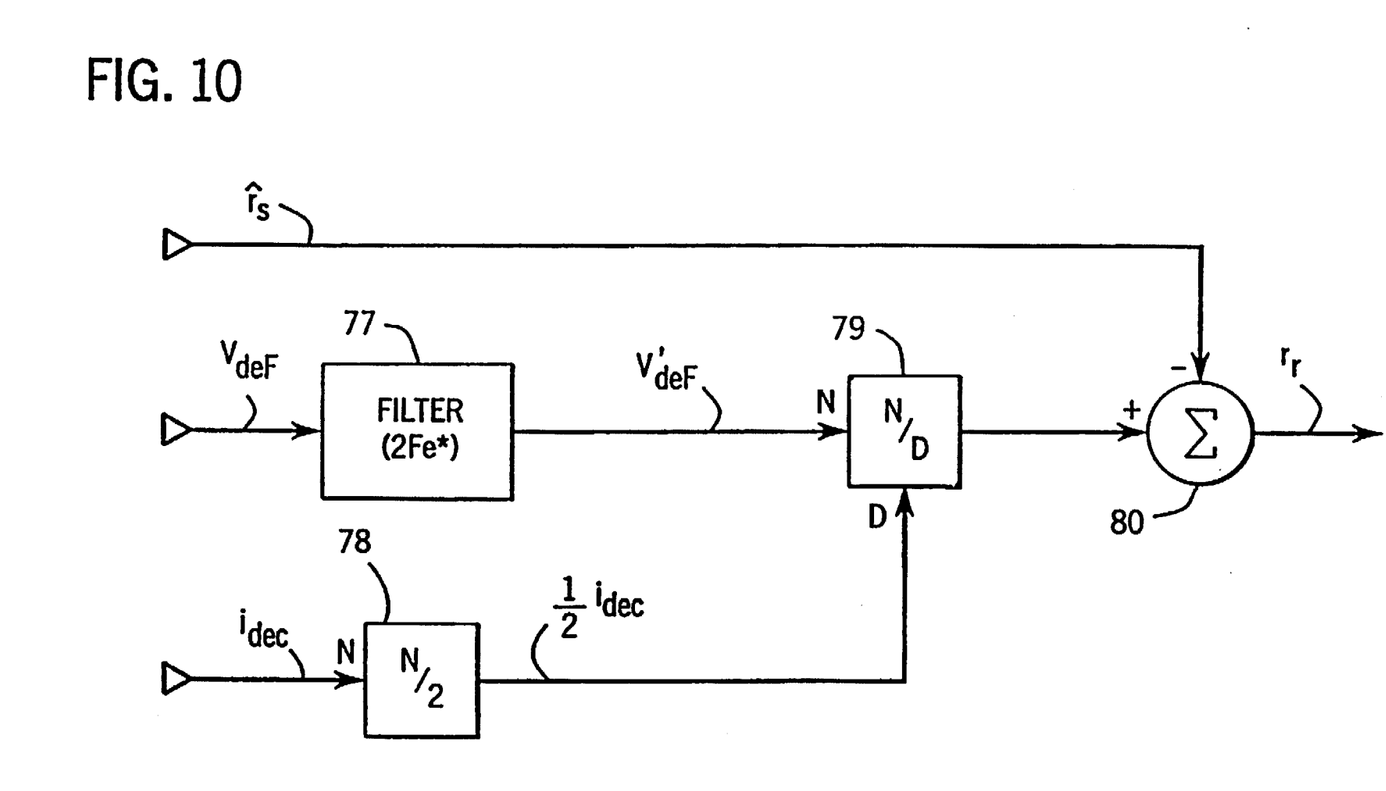
FIG. 10 provides a block diagram of a rotor resistance identifier shown in FIG. 4.

Referring now to FIG. 10, the present invention can also be used for finding rotor resistants $r_r$. Referring again to Equation 22, because the d-axis voltage $V_{de}$ can be provided, and the d-axis current $i_{de}$ can be provided, if a stator resistance estimate $r_s$ can be provided, $r_r$ can easily be found.

There are many different ways to determine a stator resistance estimate $r_s$ that are well-known in the art. Any one of these ways can be used with the present invention. The d-axis feedback voltage signal $V_{deF}$ is supplied to a filter similar to the one described above. This filter, like the earlier one, includes two digital averagers that together reduce harmonic content in the q-axis feedback voltage signal $V_{qeF}$. The filters produce a d-axis filter feedback signal $V'_{deF}$. The corrected d-axis commissioning current signal $i_{dec}$ is divided by two at divider 78 producing $i_{dec/2}$. The filtered feedback signal $V'_{deF}$ is divided by $i_{dec/2}$ at divider 79. The stator resistance estimate $r_s$ is subtracted from the resultant at summer 80 to produce the rotor resistance estimate $r_r$.

Although the present invention has been described above in the context of an apparatus, it should be understood that the present invention also contemplates a method to be used with a motor controller for determining a transient inductance estimate. The method simply comprises the steps of driving a single phase of a three phase motor with an excitation current at an operating frequency; sensing a stator feedback voltage; dividing the excitation current by two to produce a positive current signal; and mathematically combining the operating frequency, positive current signal, and the feedback voltage to produce the transient inductance estimate.

Preferably, the step of driving a single phase includes providing a d-axis current component where the q-axis current component is zero. Also preferably, the step of mathematically combining includes multiplying the operating frequency by the forward current signal to produce a current frequency signal and then dividing the d-axis voltage feedback signal by the current frequency signal. In addition, the method may also include the steps of receiving the d-axis stator voltage and filtering that signal to produce a d-axis voltage signal that is relatively free of harmonic content prior to mathematically combining.

As the method of the present invention is quite simple and most motor controllers include a central processing unit to control motor operation, the method of the present invention is particularly useful in that it could easily be implemented in software so that no additional hardware would be required.

It should also be noted that the methods and apparatuses described above are only exemplary and do not limit the scope of the invention, and that various modifications could be made by those skilled in the art that may fall under the scope of the invention. For example, as is well-known in the art, there is more than one way to drive a single phase of the motor or drive the motor in a locked manner. Any locked motor driving scheme wherein the torque on the rotor is zero could be used with the present invention. In addition, while one regulator is shown in FIG. 6, various circuits could be used to regulate the q-axis current to zero. Furthermore, other filtering schemes could be used to limit the harmonic content in the voltage feedback signals. In fact, the filtering schemes could simplify transient inductance calculations even more. In particular, because $\omega_e = 2\pi F_e$, Equation 23 could be rewritten as:

$$L_\sigma = \frac{V_q}{\pi I_d F_e} \quad (28)$$

Then $V_{qave}$ from Equation 27 could be substituted into Equation 28 to produce the following equation:

$$L_\sigma = K \cdot \frac{\sum_{i=1}^{Z} V_{qfil}}{I_d} \quad (29)$$

where, $$K = \frac{T_{\mu p}}{\pi} \cdot K_{sf} \quad (30)$$

and $K_{sf}$ is a scaling factor accounting for earlier resolution amplification and voltage and current scaling factors.

Thus, a simple and straightforward way of determining an accurate transient inductance estimate $L_\sigma$ has been described.

In addition, a simple way of determining rotor resistance has been described. Both values $L_\sigma$ and $r_r$ can be determined without rotating the rotor and by operation of minimal calculations.

In order to apprise the public of the various embodiments that may fall within the scope of the invention, the following claims are made:

We claim:

1. A transient inductance estimator for use with a three phase motor controller in which d and q-axis stator feedback voltages are used for motor control purposes, the estimator comprising:

(a) a regulator for driving a single phase of the motor with an excitation current at an operating frequency;

(b) a sensor to determine d and q-axis stationary frame stator feedback voltages;

(c) a rotator to convert the stator feedback voltages from the stationary frame of reference to synchronous frame of reference; and (d) a calculator to mathematically combine the operating frequency, a synchronous forward current component of the excitation current, and q-axis stator feedback voltage to produce the transient inductance estimate.

2. The estimator as recited in claim 1 further including a resolver that determines the forward current component by dividing the excitation current by 2.

3. The estimator as recited in claim 1 wherein the regulator drives the single phase of the motor by providing a d-axis current component where the q-axis current component is zero both the d and q-axis current components being in the stationary frame of reference.

4. The estimator as recited in claim 2 wherein the calculator mathematically combines by multiplying the operating frequency by the forward current component to produce a current-frequency signal and then dividing the q-axis voltage feedback signal by the current-frequency signal.

5. The estimator as recited in claim 1 wherein the controller provides a stator resistance estimate, the estimator further including a rotor resistance identifier that mathematically combines the forward current signal, stator resistance estimate, and d-axis synchronous stator feedback voltage to produce a rotor resistance estimate.

6. The estimator as recited in claim 5 wherein the resistance identifier mathematically combines by dividing the q-axis synchronous stator feedback voltage by the forward current signal to produce a resistive signal and subtracts the stator resistance estimate from the resistive signal to produce the rotor resistance estimate.

7. The estimator as recited in claim 1 further including a frequency filter receiving and filtering the q-axis synchronous stator voltage signal to produce a q-axis voltage signal having reduced harmonic components.

8. The estimator as recited in claim 7 wherein the filter includes an averager and a synchronized averager.

9. The estimator as recited in claim 5 further including a frequency filter receiving both the d and q-axis synchronous stator voltages and filtering both stator voltages to produce d and q-axis voltage signals having reduced harmonic components.

10. The estimator as recited in claim 1 wherein the operating frequency is between 5 and 40 Hertz.

11. The estimator as recited in claim 10 wherein the operating frequency is approximately 30 Hertz.

12. A transient inductance estimator for use with a three phase motor controller in which d and q-axis stator feedback voltages are used for motor control purposes, the estimator comprising:

(a) a regulator for driving a single phase of the motor by providing a d-axis current component in the stationary frame of reference at an operating frequency where the q-axis current component in the stationary frame of reference is zero;

(b) a sensor to determine d and q-axis stator feedback voltages in the synchronous frame of reference;

(c) a resolver to divide the d-axis current component by 2 to produce a forward current signal;

(d) a multiplier for multiplying the operating frequency by the forward current signal to produce a current-frequency signal; and (e) a divider for dividing the q-axis voltage feedback signal by the current-frequency signal to produce the transient inductance estimate.

13. The estimator as recited in claim 11 wherein the controller provides a stator resistance estimate and the estimator further including a rotor resistance identifier that divides the d-axis synchronous stator feedback voltage by the forward current signal to produce a resistive signal and subtracts the stator resistance estimate from the resistive signal to produce the rotor resistance estimate.

14. A method to be used for determining a transient inductance estimate for an AC motor, the method to be used with a motor controller in which d and q-axis stator feedback voltages are used for motor control purposes, the method comprising the steps of:

(a) driving a single phase of the motor with an excitation current at an operating frequency;

(b) determining a q-axis stator feedback voltage in the synchronous frame of reference;

(c) dividing the excitation current by 2 to produce a forward current signal; and (d) mathematically combining the operating frequency, forward current signal, and q-axis stator feedback voltage to produce the transient inductance estimate.

15. The method as recited in claim 14 wherein the step of driving the single phase of the motor includes the steps of providing a d-axis current component and regulating the q-axis current component to zero both the d and q-axis current components in the stationary frame of reference.

16. The method as recited in claim 14 wherein the step of mathematically combining includes the steps of multiplying the operating frequency by the forward current signal to produce a current-frequency signal and dividing the q-axis voltage feedback signal by the current-frequency signal.

17. The method as recited in claim 14 wherein the controller provides a stator resistance estimate and the method is also used to determine a rotor resistance estimate, the method further including the steps of determining a d-axis stator feedback voltage, dividing the d-axis stator feedback voltage by the forward current signal to produce a resistive signal, and subtracting the stator resistance estimate from the resistive signal to produce the rotor resistance estimate.

18. The method as recited in claim 14 further including the step of, prior to mathematically combining, filtering the q-axis stator voltage signal to produce a filtered q-axis voltage signal with reduced harmonic content.

* * * * *